United States Patent
Laforet et al.

(10) Patent No.: US 9,287,376 B1
(45) Date of Patent: Mar. 15, 2016

(54) METHOD OF MANUFACTURING A GATE TRENCH WITH THICK BOTTOM OXIDE

(71) Applicant: Infineon Technologies Austria AG, Villach (AT)

(72) Inventors: David Laforet, Villach (AT); Georg Ehrentraut, Villach (AT)

(73) Assignee: Infineon Technologies Austria AG, Villach (AU)

( * ) Notice: Subject to any disclaimer, the term of this patent is extended or adjusted under 35 U.S.C. 154(b) by 0 days.

(21) Appl. No.: 14/558,897

(22) Filed: Dec. 3, 2014

(51) Int. Cl.
| | |
|---|---|
| *H01L 21/28* | (2006.01) |
| *H01L 29/423* | (2006.01) |
| *H01L 21/3065* | (2006.01) |
| *H01L 21/308* | (2006.01) |
| *H01L 21/02* | (2006.01) |
| *H01L 29/66* | (2006.01) |

(52) U.S. Cl.
CPC ........ *H01L 29/4236* (2013.01); *H01L 21/0217* (2013.01); *H01L 21/02233* (2013.01); *H01L 21/02255* (2013.01); *H01L 21/3065* (2013.01); *H01L 21/3081* (2013.01); *H01L 29/66621* (2013.01)

(58) Field of Classification Search
CPC .................. H01L 21/0217; H01L 21/02233; H01L 21/02255; H01L 21/3065; H01L 21/3081; H01L 29/4236; H01L 29/66621
See application file for complete search history.

(56) References Cited

U.S. PATENT DOCUMENTS

| | | | |
|---|---|---|---|
| 6,800,509 B1 | 10/2004 | Lin et al. | |
| 2004/0214397 A1* | 10/2004 | Thapar ................ | H01L 29/0619 438/270 |
| 2009/0085107 A1 | 4/2009 | Hshieh | |
| 2013/0330892 A1 | 12/2013 | Hsieh | |

* cited by examiner

*Primary Examiner* — Daniel Shook
(74) *Attorney, Agent, or Firm* — Murphy, Bilak & Homiller, PLLC

(57) ABSTRACT

An insulated gate trench is manufactured by forming a first dielectric layer on a semiconductor substrate, forming a hardmask on the first dielectric layer and etching a trench into the semiconductor substrate through an opening in the hardmask and the first dielectric layer, the trench having sidewalls and a bottom. The sidewalls and bottom of the trench are lined with a second dielectric layer without an intervening oxide layer along the sidewalls and bottom of the trench. The second dielectric layer is removed from at least part of the bottom of the trench to expose part of the semiconductor substrate, and the exposed part of the semiconductor substrate is removed to form an oxide region at the bottom of the trench. Subsequently, a gate dielectric is formed on the sidewalls and bottom of the trench and a gate electrode in the trench without a separate field electrode in the trench.

18 Claims, 11 Drawing Sheets

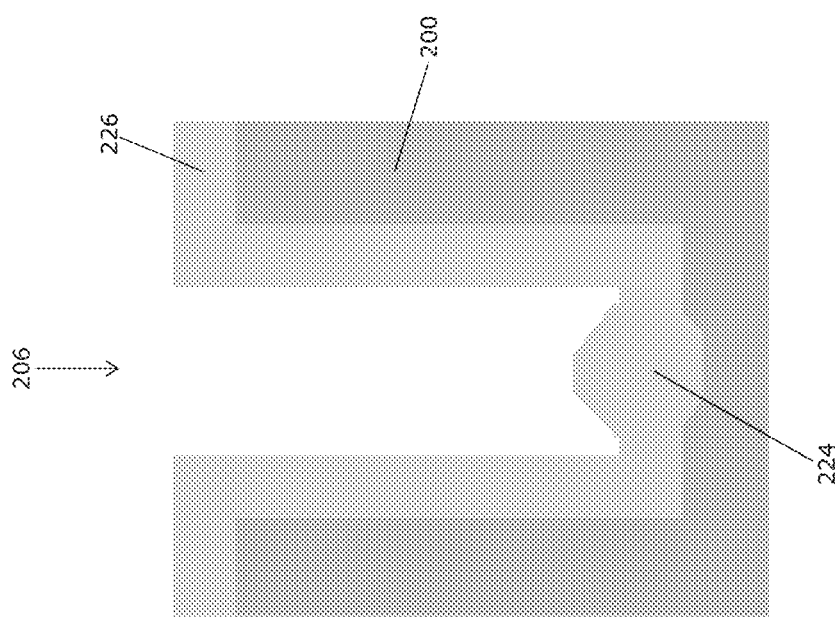

METHOD OF MANUFACTURING A GATE TRENCH WITH THICK BOTTOM OXIDE

TECHNICAL FIELD

The present application relates to stand-alone gate trenches, in particular stand-alone gate trenches with a thick bottom oxide.

BACKGROUND

In power MOSFETs (metal oxide semiconductor field effect transistors) with dual poly field plate trench technology, the gate electrode is above the field plate electrode and the charge between the gate and drain (Qgd) is defined by the sidewall overlap of the gate electrode to the silicon part of the device below the body. In the case of a stand-alone gate electrode concept i.e. no field electrode in the same trench as the gate electrode, the overlap between the gate electrode and the silicon part of the device below the body is increased due to the overlap between the bottom of the gate trench and the silicon. The increase in Qgd can be significant. Increased Qgd results in reduced overall switching performance.

One conventional approach for addressing this problem involves forming a thick bottom oxide at the bottom of the gate electrode trench using a deposition method such as HDP (high-density plasma) chemical vapor deposition which creates a thicker oxide at the bottom of the trench as compared to along the trench sidewalls. Another approach involves damaging the silicon at the bottom of the trench using a damage implant to achieve an enhanced oxidation rate. Yet another approach involves protecting the sidewall and top part of the trench with a single protective layer while removing the protective layer at the bottom of the trench so it can be oxidized. In the last approach, it is difficult to ensure that the protective layer is completely removed at the bottom of the trench while also ensuring that the other parts of the trench (sidewall and top) are fully protected from the trench bottom oxidation process. The last approach is particularly difficult to implement over a wide process window because small device features and high aspect ratios require the use of a very thin protective layer which exasperates the problem.

SUMMARY

According to an embodiment of a method of manufacturing an insulated gate trench, the method comprises: forming a first dielectric layer on a semiconductor substrate; forming a hardmask on the first dielectric layer; etching a trench into the semiconductor substrate through an opening in the hardmask and the first dielectric layer, the trench having sidewalls and a bottom; lining the sidewalls and bottom of the trench with a second dielectric layer without an intervening oxide layer along the sidewalls and bottom of the trench; removing the second dielectric layer from at least part of the bottom of the trench to expose part of the semiconductor substrate; oxidizing the exposed part of the semiconductor substrate to form an oxide region at the bottom of the trench; and subsequently forming a gate dielectric on the sidewalls and bottom of the trench and a gate electrode in the trench without a separate field electrode in the trench.

According to another embodiment of a method of manufacturing an insulated gate trench, the method comprises: etching a trench into a semiconductor substrate, the trench having sidewalls and a bottom; protecting an upper part of the trench with first and second silicon nitride layers and a lower part of the trench with only the second silicon nitride layer and without an intervening oxide layer between the second silicon nitride layer and the sidewalls and bottom of the trench; removing the second silicon nitride layer from at least part of the bottom of the trench to expose part of the semiconductor substrate; oxidizing the exposed part of the semiconductor substrate to form an oxide region at the bottom of the trench; forming a gate dielectric on the sidewalls and bottom of the trench after removing the first and second silicon nitride layers; and subsequently forming a gate electrode in the trench without a separate field electrode in the trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2J illustrate an embodiment of a method of manufacturing an insulated gate trench using a dual protective layer structure.

DETAILED DESCRIPTION

The embodiments described herein provide a method of manufacturing a thick bottom oxide in a power MOSFET device with a stand-alone gate electrode by using a dual protective layer structure. The dual protective layer structure protects the top corners of the gate trench during a trench bottom oxidation process. The thickness of the dual protective layer structure can be independently tuned at the top and the bottom of the gate trench to accommodate a wide process window including for small device features and high aspect ratios. The resulting power MOSFET device has reduced parasitic gate-drain charge (Qgd) and high gate trench structure integrity over a wide process window.

Figure 1:
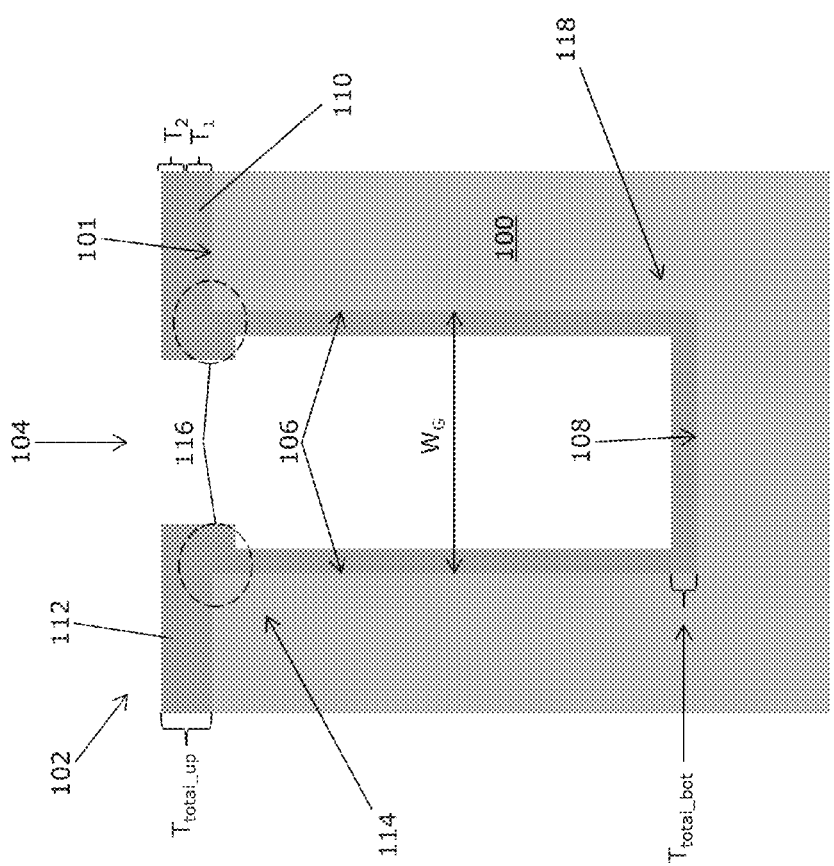
FIG. 1 illustrates a sectional view of an embodiment of part of a semiconductor substrate that has a dual protective layer structure used to form a gate trench.

FIG. 1 illustrates a sectional view of part of a semiconductor substrate 100 such as a silicon substrate that has a dual protective layer structure 102 used to form a gate trench 104. The gate trench 104 is etched into the semiconductor substrate 100 from a main surface 101 of the substrate 100. The gate trench 100 has sidewalls 106 and a bottom 108. The dual protective layer structure 102 includes a first dielectric layer 110 formed on the main surface 101 of the semiconductor substrate 100. The dual protective layer structure 102 further includes a second dielectric layer 112 which lines the sidewalls 106 and bottom 108 of the trench 104 without any intervening oxide layer along the trench sidewalls 106 and bottom 108 i.e. no oxide layer is purposely interposed between the second dielectric layer 112 and the sidewalls 106 and bottom 108 of the trench 104.

The first and second dielectric layers 110, 112 of the dual protective layer structure 102 protect the upper part 114 of the trench 104, especially the top corner regions 116 of the trench 104, during a subsequent trench bottom oxidation process. The total thickness ($T_{total\_up}$) of the dual protective layer structure 102 at the upper part 114 of the gate trench 4 corresponds to the thickness ($T_1$) of the first dielectric layer 110 plus the thickness ($T_2$) of the second dielectric layer 112. The thickness ($T_{total\_bot}$) of the dual protective layer structure 102 at the bottom part 118 of the gate trench 104 corresponds to the thickness $T_2$ of just the second dielectric layer 1112.

The lower part 118 of the gate trench 104 is protected only by the second dielectric layer 112 without any intervening oxide layer between the second dielectric layer 112 and the sidewalls 106 and bottom 108 of the trench 104. This way, the second dielectric layer 112 can be removed from at least part of the bottom 108 of the trench 104 to expose part of the semiconductor substrate 100 while the top corner regions 116 of the trench 104 remain adequately protected. This feature is particularly critical for small gate trench dimensions such as for a gate width $W_G$ of 200 nm or less. For such small gate dimensions, the flexibility to independently tune the thickness of the dual protective layer structure 102 at the top 114 and the bottom 118 of the trench 104 is especially important. In this case, the second dielectric layer 112 is made thin enough to not close off the trench 104. In order to remove such a thin layer from the bottom 108 of the gate trench 104 with enough repeatability, a certain amount of over-etch can be employed. The dual protective layer structure 102 allows for adjustment of the thickness of the first dielectric layer 110 independent of the thickness of the second dielectric layer 112, so that the top corners 116 of the gate trench 104 can be reliably protected while over-etching the second dielectric layer 112 which functions as a thin sidewall/bottom liner in this example.

FIGS. 2A through 2J illustrate an embodiment of a method of manufacturing an insulated gate trench using a dual protective layer structure. The manufacturing method is explained next with reference to a silicon substrate. The silicon substrate can comprise a silicon wafer with one or more epitaxial layers. Other types of semiconductor substrates can be used.

Figure 2A:
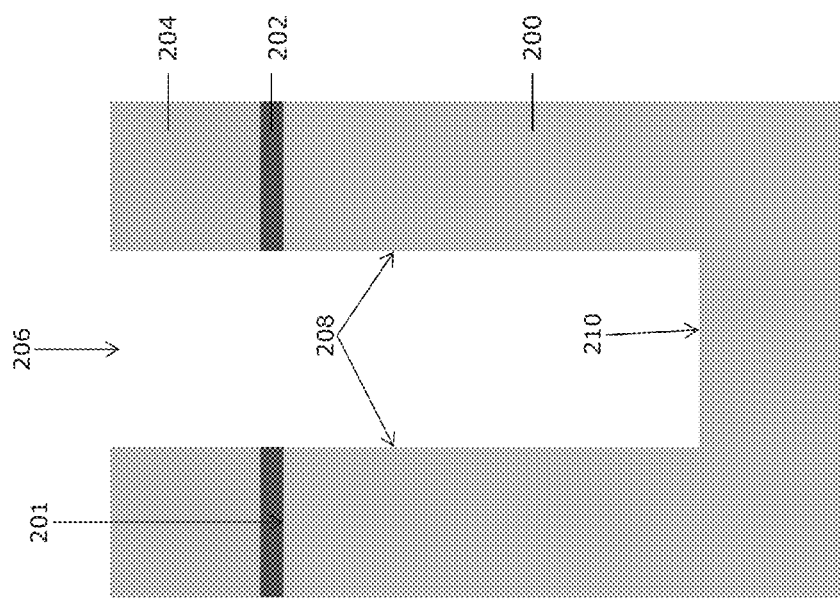

FIG. 2A shows a silicon substrate 200 after a first dielectric layer 202 such a silicon nitride is formed on the silicon substrate 200, a hardmask 204 such as TEOS (tetraethyl orthosilicate) is formed on the first dielectric layer 202 and a trench 206 is etched into the semiconductor substrate 200 through an opening in the hardmask 204 and first dielectric layer 202. Any standard trench lithographic patterning and etch process can be used to form the trench 206. The remaining part of the first dielectric layer 202 protects the top main surface 201 of the semiconductor mesa between adjacent ones of the trenches 206 (only one trench is shown in FIGS. 2A). The resulting trench 206 has sidewalls 208 and a bottom 210.

Figure 2B:
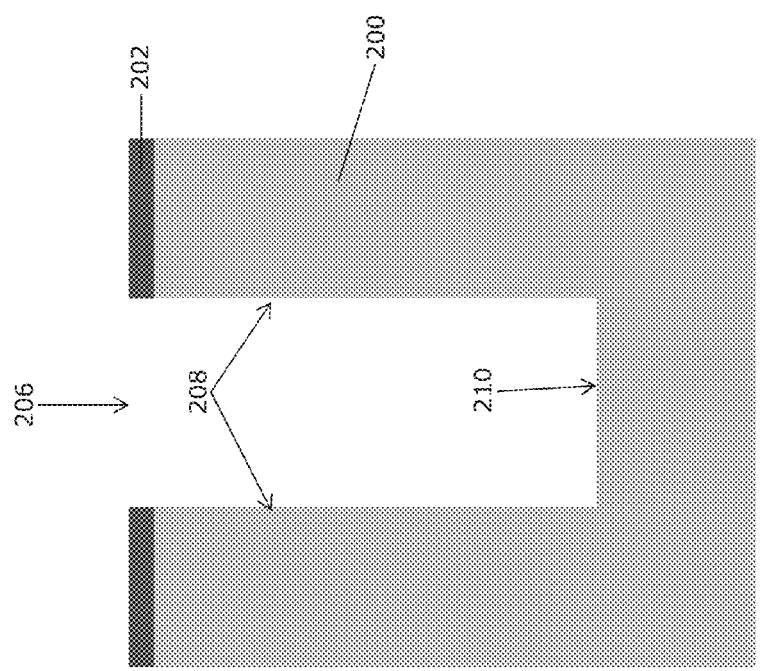

FIG. 2B shows the hardmask 204 removed after the trench etch process. The hardmask 204 can be removed using any standard hardmask removal process such as wet HF etching, vapor HF etching, etc. In one embodiment, the hardmask 204 is removed after the trench 206 is etched into the semiconductor substrate 200 and prior to any subsequent oxidation processes.

Figure 2C:
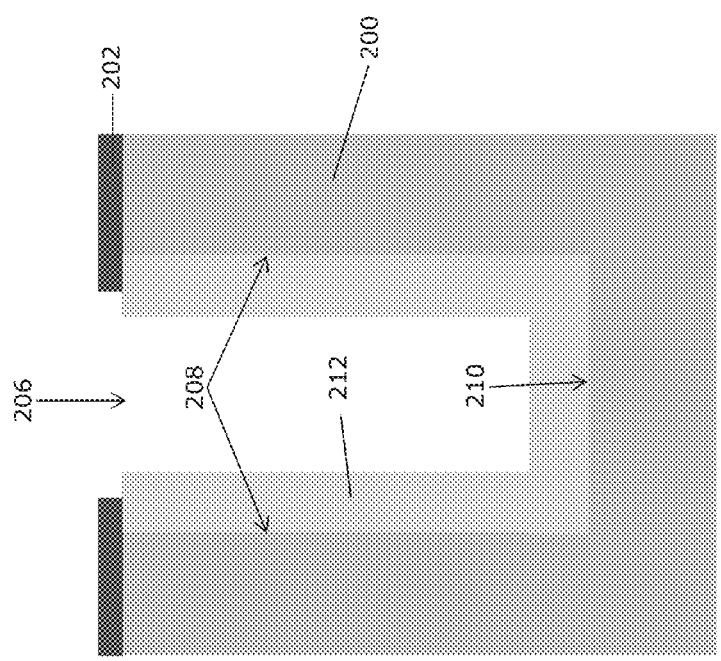

FIG. 2C shows the sidewalls 208 and bottom 210 of the trench 206 after being oxidized e.g. via a thermal oxidation process to form a sacrificial oxide 212 before the trench sidewalls 208 and bottom 210 are lined with a second dielectric layer. The oxidation process converts the silicon material adjacent the sidewalls 208 and bottom 210 of the trench 206 to oxide, thus effectively widening the trench 206.

Figure 2D:
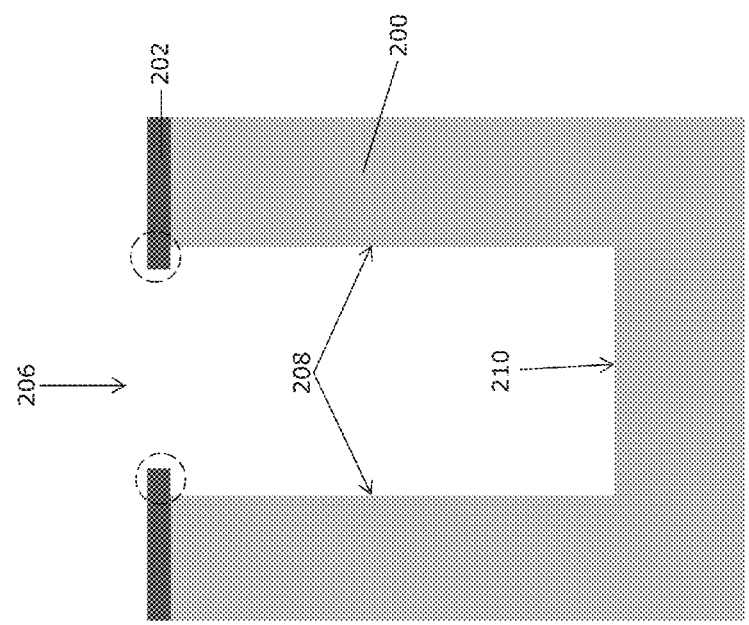

FIG. 2D shows the sacrificial oxide 212 removed before the sidewalls 208 and bottom 210 of the trench 206 are lined with a second dielectric layer. Any standard oxide removal process can be employed. The first dielectric layer 202 overhangs the sidewalls 208 of the widened trench 206 after the sacrificial oxide 212 is removed as indicated by the dashed circles shown in FIG. 2D.

Figure 2E:
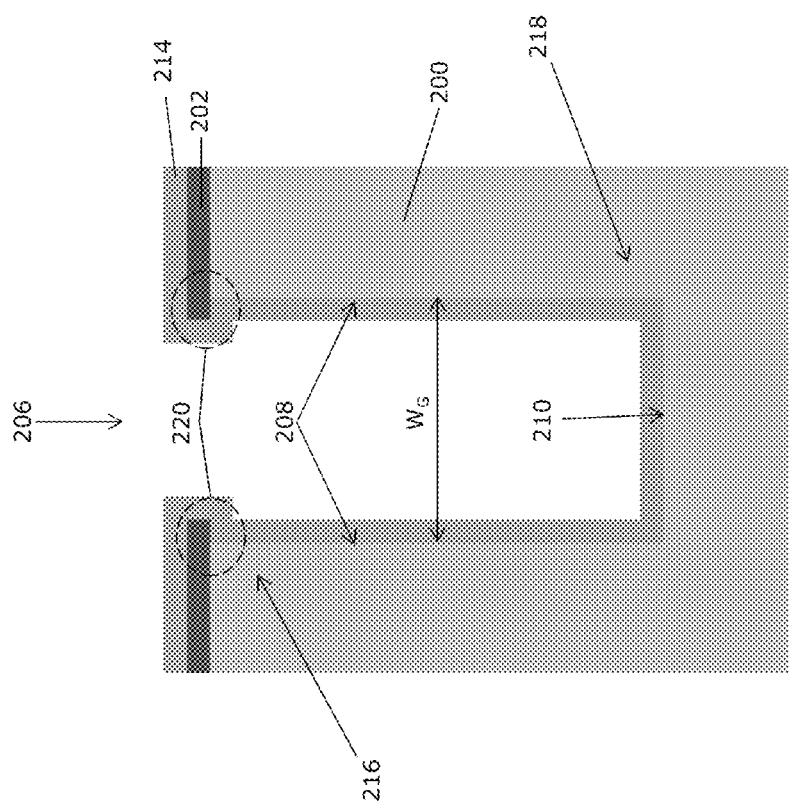

FIG. 2E shows lining the sidewalls 208 and bottom 210 of the trench 206 with a second dielectric layer 214 such as silicon nitride without any intervening oxide layer along the trench sidewalls 208 and bottom 210 i.e. no oxide layer is purposely interposed between the second dielectric layer 214 and the sidewalls 208 and bottom 210 of the trench 206. Notably, the earlier formed sacrificial oxide 212 is removed before lining the sidewalls 208 and bottom 210 of the trench 206 with the second dielectric layer 214. In one embodiment, the first and second dielectric layers 202, 214 comprise the same dielectric material e.g. silicon nitride. Regardless, the first and second dielectric layers 202, 214 form a dual protective layer structure for which the thickness at the top 216 of the trench 206 can be tuned independently from the thickness at the bottom 218 of the trench 206, so as to maximize the process window for the subsequent bottom trench etch process shown in FIG. 2F. For example in the case of a gate width $W_G$ of 200 nm or less, the flexibility to independently tune the thickness of the dual protective layer structure at the top 216 and the bottom 218 of the trench 206 allows for the second dielectric layer 214 to be made thin enough to not close off the trench 206. In order to later remove such a thin layer from the bottom 210 of the trench 206 with enough repeatability and over a wide process window, a certain amount of over-etch can be employed. The dual protective layer structure allows for adjustment of the thickness of the first dielectric layer 202 independent of the thickness of the second dielectric layer 214, so that the top corners 220 of the trench 206 can be reliably protected while using only the second dielectric layer 214 as a thin sidewall/bottom liner.

Figure 2F:
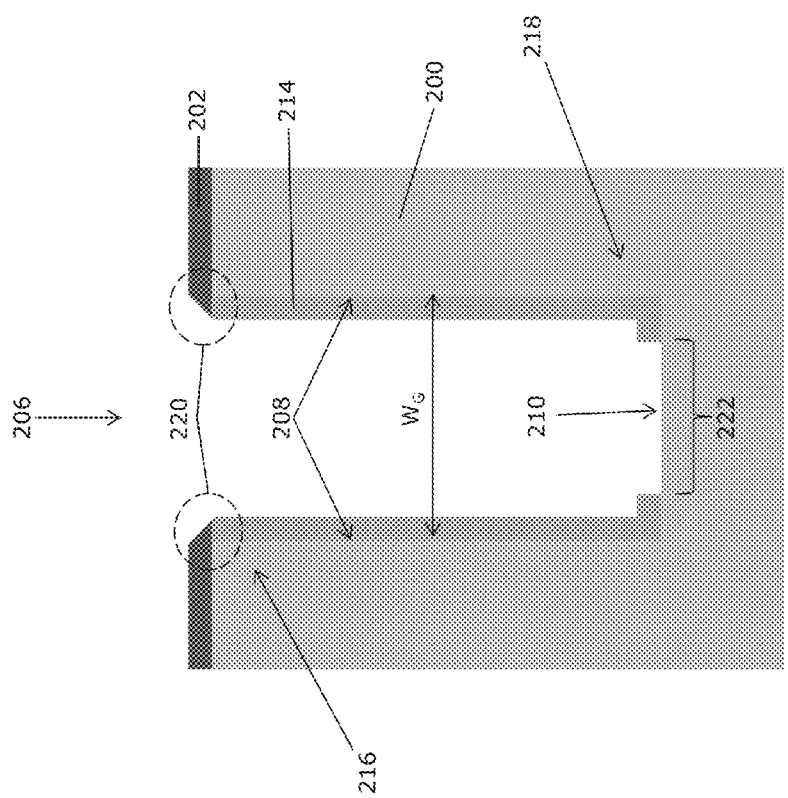

FIG. 2F shows removing the second dielectric layer 214 from at least part of the bottom 210 of the trench 206 to expose part 222 of the underlying silicon substrate 200. In the case of a silicon nitride second dielectric layer 214, the second dielectric layer 214 can be removed from at least part of the trench bottom 210 by anisotropic dry etching to expose part 222 of the silicon substrate 200 at the trench bottom 210 while the second dielectric layer 214 remains intact along the trench sidewalls 208. The top corners 220 of the trench 204 remain protected during the anisotropic dry etching because of the greater thickness of the dual protective layer structure at the upper part 216 of the trench 206. This way, some over-etching of the second dielectric layer 214 is permitted without exposing the top corners 220 of the trench 206. In one embodiment, the second dielectric layer 214 is thinner than the first dielectric layer 202 so that the top trench corners 220 are not exposed during the anisotropic dry etching of the second dielectric layer 214 along the bottom 210 of the trench 206.

Figure 2G:
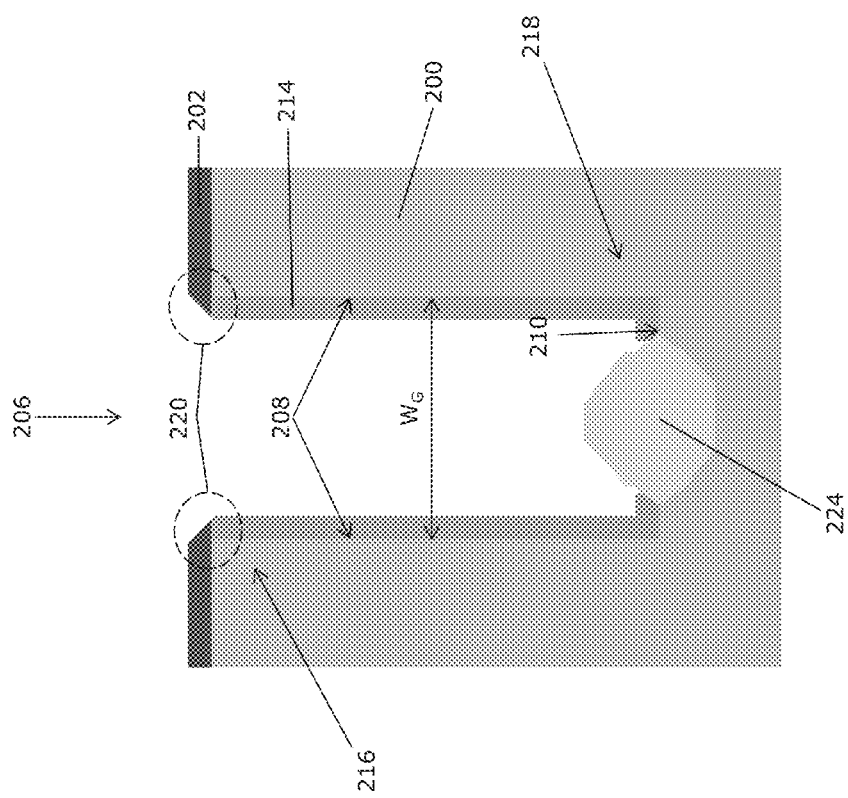

FIG. 2G shows oxidizing the exposed part 222 of the silicon substrate 200 to form an oxide region 224 at the bottom 210 of the trench 206. In one embodiment, the exposed part 222 of the silicon substrate 200 is thermally oxidized to form the oxide region 224 at the bottom 210 of the trench 206. The exposed part 222 of the silicon substrate 200 can be oxidized to form the trench bottom oxide region 224 without first etching into the exposed part 222 of the silicon substrate 200. In either case, the trench bottom oxide region 224 is formed before the gate dielectric is formed.

Figure 2H:
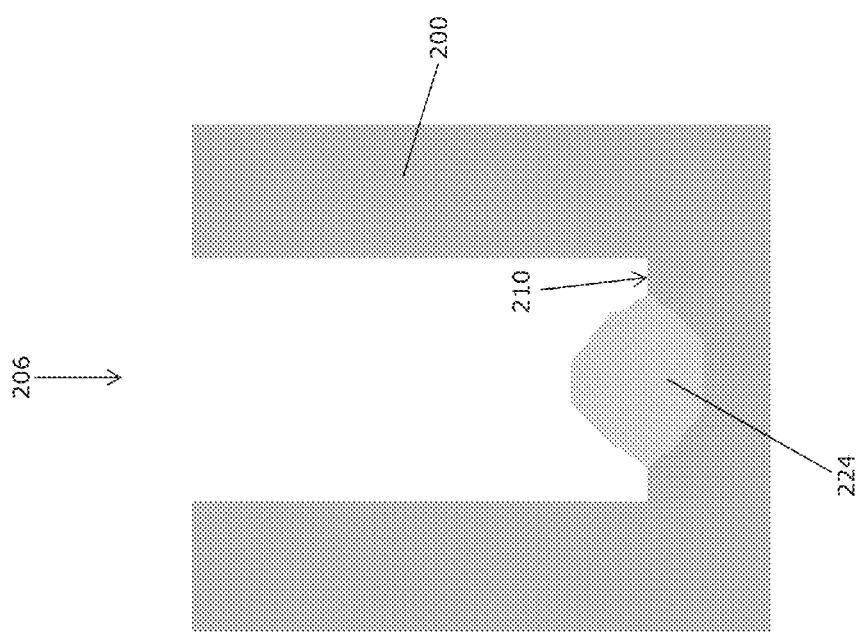

FIG. 2H shows removing of the first and second dielectric layers 202, 214. Any standard dielectric removal process can be used to remove the first and second dielectric layers 202, 214. The first and second dielectric layers 202, 214 comprise a material or materials which can be etched selective to the oxide region 224 at the bottom 210 of the trench 206 so that the trench bottom oxide region 224 is not removed during removal of the first and second dielectric layers 202, 214. For example, the first and second dielectric layers 202, 214 can comprise silicon nitride which can be etched selective to the trench bottom oxide region 224.

FIG. 2I shows oxidation of the sidewalls 208 and bottom 210 of the trench 206 to form a gate dielectric 226. The resulting gate dielectric trench liner includes the earlier formed oxide region 224 at the bottom 210 of the trench 206 and the later formed gate dielectric 226. The dielectric trench liner is thicker along the trench bottom 210 than along the trench sidewalls 208 due to the presence of the trench bottom oxide region 224. The additional dielectric thickness realized at the bottom 210 of the trench 206 corresponds to the thickness of the earlier formed trench bottom oxide region 224.

Figure 2J:
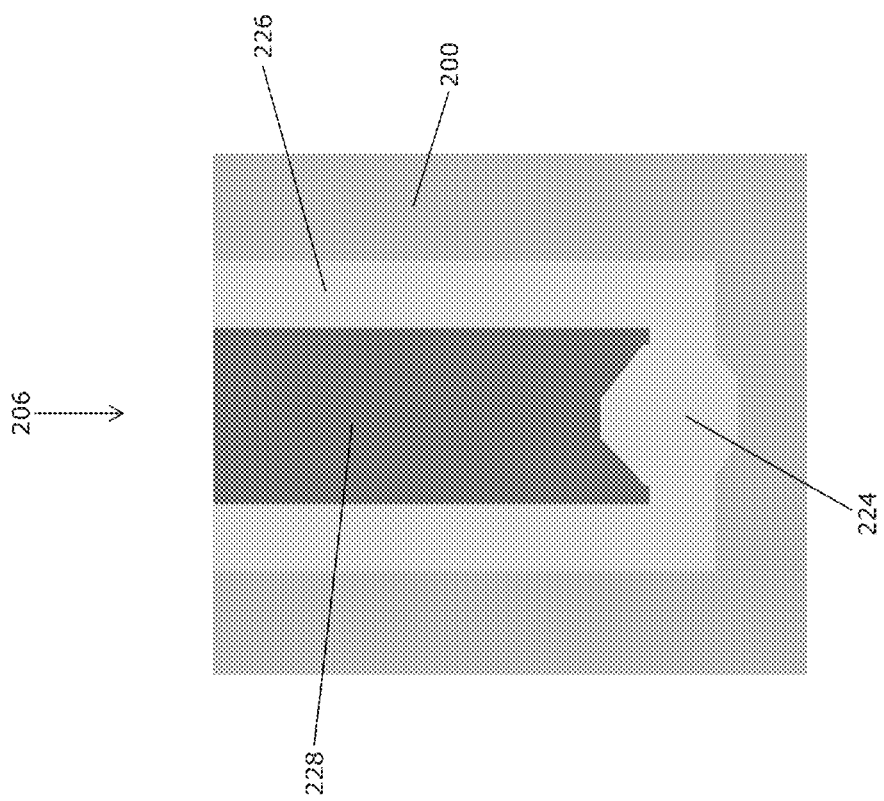

FIG. 2J shows forming a gate electrode 228 in the trench 206 without a separate field electrode in the trench 206 after planarization. The gate electrode 228 can comprise metal, doped polysilicon, etc. The resulting power MOSFET device has reduced parasitic gate-drain charge (Qgd) along the bottom 210 of the trench 206 due to the presence of the trench bottom oxide region 224.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing an insulated gate trench, the method comprising:
    forming a first dielectric layer on a semiconductor substrate;
    forming a hardmask on the first dielectric layer;
    etching a trench into the semiconductor substrate through an opening in the hardmask and the first dielectric layer, the trench having sidewalls and a bottom;
    lining the sidewalls and bottom of the trench with a second dielectric layer without an intervening oxide layer along the sidewalls and bottom of the trench;
    removing the second dielectric layer from at least part of the bottom of the trench to expose part of the semiconductor substrate;
    oxidizing the exposed part of the semiconductor substrate to form an oxide region at the bottom of the trench; and
    subsequently forming a gate dielectric on the sidewalls and bottom of the trench and a gate electrode in the trench without a separate field electrode in the trench.

2. The method of claim 1, wherein the exposed part of the semiconductor substrate is oxidized to form the oxide region at the bottom of the trench without first etching into the exposed part of the semiconductor substrate.

3. The method of claim 1, wherein the first and second dielectric layers comprise the same dielectric material.

4. The method of claim 3, wherein the first and second dielectric layers comprise silicon nitride.

5. The method of claim 1, wherein the exposed part of the semiconductor substrate is thermally oxidized to form the oxide region at the bottom of the trench.

6. The method of claim 1, wherein the second dielectric layer is removed from at least part of the bottom of the trench by anisotropic dry etching to expose part of the semiconductor substrate.

7. The method of claim 1, wherein the second dielectric layer is thinner than the first dielectric layer.

8. The method of claim 1, wherein the trench has a width of 200 nm or less.

9. The method of claim 1, further comprising:
    oxidizing the sidewalls and bottom of the trench to form a sacrificial oxide before lining the sidewalls and bottom with the second dielectric layer; and
    removing the sacrificial oxide before lining the sidewalls and bottom of the trench with the second dielectric layer, so that the trench is widened and the first dielectric layer overhangs the sidewalls of the widened trench.

10. The method of claim 1, further comprising:
    removing the hardmask after the trench is etched into the semiconductor substrate and prior to any subsequent oxidation processes.

11. A method of manufacturing an insulated gate trench, the method comprising:
    etching a trench into a semiconductor substrate, the trench having sidewalls and a bottom;
    protecting an upper part of the trench with first and second silicon nitride layers and a lower part of the trench with only the second silicon nitride layer and without an intervening oxide layer between the second silicon nitride layer and the sidewalls and bottom of the trench;
    removing the second silicon nitride layer from at least part of the bottom of the trench to expose part of the semiconductor substrate;
    oxidizing the exposed part of the semiconductor substrate to form an oxide region at the bottom of the trench;
    forming a gate dielectric on the sidewalls and bottom of the trench after removing the first and second silicon nitride layers; and
    subsequently forming a gate electrode in the trench without a separate field electrode in the trench.

12. The method of claim 11, wherein the exposed part of the semiconductor substrate is oxidized to form the oxide region at the bottom of the trench without first etching into the exposed part of the semiconductor substrate.

13. The method of claim 11, wherein the exposed part of the semiconductor substrate is thermally oxidized to form the oxide region at the bottom of the trench.

14. The method of claim 11, wherein the second silicon nitride layer is removed from at least part of the bottom of the trench by anisotropic dry etching to expose part of the semiconductor substrate.

15. The method of claim 11, wherein the second silicon nitride layer is thinner than the first silicon nitride layer.

16. The method of claim 11, wherein the trench has a width of 200 nm or less.

17. The method of claim 11, wherein the first silicon nitride layer is disposed on a surface of the semiconductor substrate from which the trench extends into the semiconductor substrate, and wherein the second silicon nitride layer lines the sidewalls and bottom of the trench without an intervening oxide layer along the sidewalls and bottom.

18. The method of claim 17, further comprising:
oxidizing the sidewalls and bottom of the trench to form a sacrificial oxide before the sidewalls and bottom are lined with the second silicon nitride layer; and
removing the sacrificial oxide before the sidewalls and bottom of the trench are lined with the second silicon nitride layer, so that the trench is widened and the first silicon nitride layer overhangs the sidewalls of the widened trench.

\* \* \* \* \*